United States Patent
Yun et al.

(10) Patent No.: US 6,504,287 B2
(45) Date of Patent: Jan. 7, 2003

(54) MULTILAYERED PIEZOELECTRIC/ELECTROSTRICTIVE CERAMIC ACTUATOR

(75) Inventors: Sang Kyeong Yun, Suwon-Shi (KR); Dong Hoon Kim, Suwon-Shi (KR); Jong-Myeon Lee, Gunpo-Shi (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/021,095

(22) Filed: Dec. 12, 2001

(65) Prior Publication Data

US 2002/0125793 A1 Sep. 12, 2002

Related U.S. Application Data

(62) Division of application No. 09/429,829, filed on Oct. 29, 1999, now Pat. No. 6,347,441.

(30) Foreign Application Priority Data

Jul. 7, 1999 (KR) ............................................. 99-27324

(51) Int. Cl.[7] ............................................... H01L 41/00
(52) U.S. Cl. ...................... 310/328; 310/800; 29/25.35; 427/100
(58) Field of Search ................................. 310/328, 800; 29/25.35; 347/70, 71, 72; 427/100

(56) References Cited

U.S. PATENT DOCUMENTS 4,700,203 A * 10/1987 Yamamuro et al. ......... 310/800
6,149,968 A * 11/2000 Shimada .................... 29/25.35

* cited by examiner

Primary Examiner—Brian Sircus
Assistant Examiner—Michael C. Zarroli
(74) Attorney, Agent, or Firm—Darby & Darby

(57) ABSTRACT

The present invention relates a manufacturing method for a multilayered piezoelectric/electrostrictive ceramic actuator by a sintering process at low temperature. The present invention makes feasible a high quality image and high speed printing, as large displacement and high speed actuation are feasible because it can get greater displacement and driving speed, even with small variation in driving voltage, because of piezoelectric/electrostrictive layer and upper electrode being alternately heaped to produce a multilayer structure.

14 Claims, 1 Drawing Sheet

MULTILAYERED PIEZOELECTRIC/ELECTROSTRICTIVE CERAMIC ACTUATOR

This is a division, of application Ser. No. 09/429,829, filed Oct. 29, 1999 now U.S. Pat. No. 6,347,441. Each of these prior applications is hereby incorporated herein by reference, in its entirely.

BACKGROUND OF THE INVENTION

1. Field of the Invention

The present invention relates to a piezoelectric/electrostrictive ceramic actuator. In particular, the present invention relates to a piezoelectric/electrostrictive ceramic actuator with a multilayered suprastructure and a piezoelectric/electrostrictive layer.

2. Description of the Prior Art

An actuator should move quickly with sufficient displacement to deliver ink drops if a specific size and at a specific speed from an ink jet printer head.

It is a general practice that an ink jet printer head actuator comprise a vibration plate bound with infrastructure, a lower electrode formed on the vibration plate, a piezoelectric/electrostrictive layer formed on the lower electrode, and an upper electrode formed on the piezoelectric/electrostrictive layer.

For an actuator so comprised, if electricity is supplied to the upper and lower electrodes, piezoelectric/electrostrictive layer placed between the electrodes vibrates according to the electricity, cycling between deformation and restoration.

The usual piezoelectric/electrostrictive ceramic actuator structure is illustrated in FIG. 1.

It is a general practice in the actuator shown in FIG. 1: to form on the vibration plate (12) a lower electrode (14) of platinum etc. and a chamber plate (10) made of zirconia etc.; to form a piezoelectric/electrostrictive layer (16) on the lower electrode (14) using ceramic oxide powder, which requires heat treatment at high temperature, as it has been prepared by ordinarily used solid phase process; and to form an upper electrode (18) of silver etc. on the piezoelectric/electrostrictive layer (16).

For such actuators, only a few materials which endure heat treatment above 1000° C. can be used as material of a vibration plate or a chamber plate, because a piezoelectric/electrostrictive layer is formed of ceramic oxide powder requiring a heat treatment above 1000° C. So there is a disadvantage that sorts of material usable for the vibration plate or the chamber plate are limited.

Voltage above a certain value should be applied to exert a proper displacement, because it is formed of one layer. The voltage supplied for the actuator to exert the displacement must be high, because the particle size of ceramic oxide powder prepared by solid phase process is relatively large, 0.2–2 $\mu$m, so that the piezoelectric/electrostrictive layer formed is 20–30 $\mu$m thick.

The driving voltage of piezoelectric/electrostrictive ceramic actuator for use in an ink jet head is dependent upon the properties of the substance comprising the actuator, including actuator thickness, piezoelectric/electrostrictive material properties, vibration plate characteristics etc. and is determined within a range that can produce sufficient displacement speed. Such a driving voltage of the piezoelectric/electrostrictive ceramic actuator for an ink jet head is generally within a range near 20–30 V.

Greater driving speed and displacement is required for the ink jet printer head to function as a high performance printer head. But a method ordinarily used to get greater driving speed and displacement is to increase the drive voltage, in which case the drive circuit unit price for manufacture is increased, and there is another problem that bad product can occur, because it must endure higher process voltages.

SUMMARY OF THE INVENTION

The purpose of the present invention is to provide a manufacturing method of a piezoelectric/electrostrictive ceramic actuator capable of high speed and large displacement vibration by manufacturing a multilayered piezoelectric/electrostrictive ceramic actuator using ceramic paste feasible of low temperature formation of piezoelectric/electrostrictive layer.

The invention, to accomplish the purpose, features a manufacturing method of a multilayered piezoelectric/electrostrictive ceramic actuator made by a sintering process at low temperature, the method comprising the steps of: providing a metal vibration plate; forming a piezoelectric/electrostrictive layer on the vibration plate using ceramic paste prepared by mixing ultrafine ceramic oxide powder below 5 $\mu$m of particle size made by a nonexplosive oxidative-reductive combustion reaction at a relatively low temperature of 100–500° C., having basic composition elements of lead and titanium, and ceramic sol solution of the same or similar composition with the ultrafine ceramic oxide powder, prepared on a base of water or organic solvent; thermally treating the piezoelectric/electrostrictive layer at 100–800° C.; forming an upper electrode on the piezoelectric/electrostrictive layer; and repeating the steps of forming a piezoelectric/electrostrictive layer on the vibration plate, thermally treating the layer, and forming an upper electrode on the layer, whereby multilayered piezoelectric/electrostrictive layer and upper electrode are formed.

The invention features a manufacturing method of a multilayered piezoelectric/electrostrictive ceramic actuator by a sintering process at low temperature, the method comprising the steps of: providing a vibration plate; forming a lower electrode on the vibration plate; forming a piezoelectric/electrostrictive layer on the lower electrode top using ceramic paste prepared by mixing ultrafine ceramic oxide powder below 5 $\mu$m in particle size made by a nonexplosive oxidative-reductive combustion reaction at a relatively low temperature of 100–500° C., having basic composition elements of lead and titanium, and ceramic sol solution of the same or similar composition with the ultrafine ceramic oxide powder, prepared on a base of water or organic solvent; thermally treating the piezoelectric/electrostrictive layer at 100–800° C.; forming an upper electrode on the piezoelectric/electrostrictive layer; and repeating the steps of forming a piezoelectric/electrostrictive layer on the vibration plate, thermally treating the layer, and forming an upper electrode on the layer, whereby multilayered piezoelectric/electrostrictive layer and upper electrode are formed.

The invention also features a multilayered piezoelectric/electrostrictive ceramic actuator manufactured by a sintering process at low temperature, the actuator comprising: a metal vibration plate; a piezoelectric/electrostrictive. Layer on the vibration plate using ceramic paste prepared by mixing ultrafine ceramic oxide powder below 5 $\mu$m of particle size made by a nonexplosive oxidative-reductive combustion reaction at a relatively low temperature of 100–500° C., having basic composition elements of lead and titanium, and ceramic sol solution of the same or similar composition with the ultrafine ceramic oxide powder, prepared on the base of water or organic solvent; and an upper electrode formed on the piezoelectric/electrostrictive layer, wherein a multilayer structure is formed by forming the piezoelectric/electrostrictive layers and the upper electrodes alternatively of each other.

The invention also features a multilayered piezoelectric/electrostrictive ceramic actuator manufactured by a sintering process at low temperature, the actuator comprising: a vibration plate; a lower electrode formed on the vibration plate; a piezoelectric/electrostrictive layer on the lower electrode using ceramic paste prepared by mixing ultrafine ceramic oxide powder below 5 μm of particle size made by a nonexplosive oxidative-reductive combustion reaction at a relatively low temperature of 100–500° C., having basic composition elements of lead and titanium, and ceramic sol solution of the same or similar composition with the ultrafine ceramic oxide powder, prepared on the base of water or organic solvent; and an upper electrode formed on the piezoelectric/electrostrictive layer, wherein a multilayered structure is formed by forming the piezoelectric/electrostrictive layers and the upper electrodes alternatively of each other.

DETAILED DESCRIPTION OF THE PREFERRED EMBODIMENT

Figure 1:
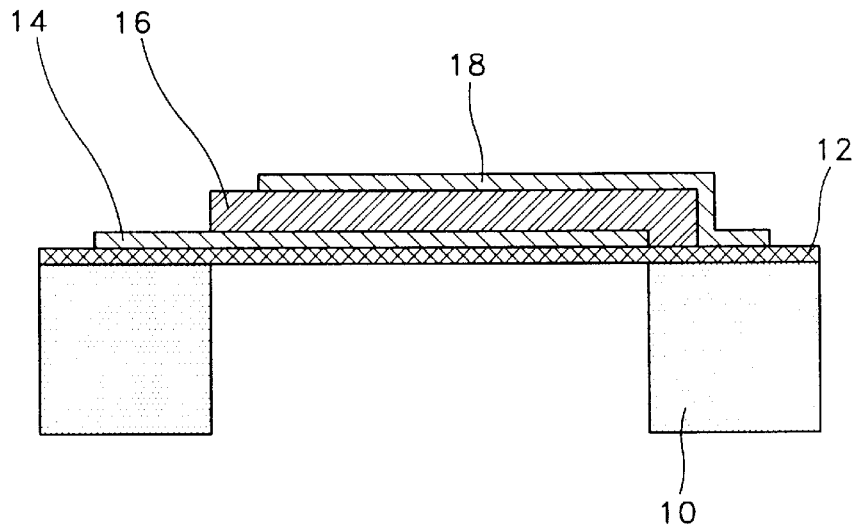
FIG. 1 is a cross sectional view roughly showing a conventional piezoelectric/electrostrictive ceramic actuator.

The invention is explained in detail as follows.

Metal, ceramic or resinous polymeric organic compound may be used as an actuator vibration plate.

Various traditional alloys can be used as the metal, among which it is particularly preferable to use stainless steel (SUS) or nickel.

It is preferable to use alumina ($Al_2O_3$), zirconia ($ZrO_2$), silicon (Si), silicon carbide (SiC), silicon nitride ($Si_3N_4$), silicon oxide ($SiO_2$) or glass series for the ceramic.

And it is preferable to use polyester, polyimide, polyethyleneimide or Teflon series for the resinous polymeric organic compound.

There is no need to form a separate lower electrode if metal is used as a vibration plate because metal itself is conductive, while a separate lower electrode must be formed if ceramic or resinous polymeric organic compound is used for a vibration plate.

A lower electrode is formed by vacuum evaporation, sputtering or screen printing etc. using gold, silver, aluminum, nickel, platinum etc.

The lower electrode may be formed on the whole vibration plate, or only a necessary part, using a mask.

A piezoelectric/electrostrictive layer is formed on the metal vibration plate, or on the ceramic or the resinous polymeric organic compound vibration plate where the lower electrode has been formed.

Piezoelectric/electrostrictive ceramic paste capable of heat treatment at low temperature is used for the material of the piezoelectric/electrostrictive layer.

The piezoelectric/electrostrictive ceramic paste is prepared by mixing ceramic oxide powder with a ceramic sol solution compatible with the powder and of same or similar composition with the powder.

As for the ceramic oxide powder, because it is more effective to use finer powder to secure a system feasible of low temperature formation considering the powder reactivity itself, it is manufactured by the steps of: sufficiently dissolving or uniformly dispersing the raw material of constituent ceramic elements in solvent or dispersant to make a solution or a dispersion mixture containing the constituent ceramic elements; adding, into the solution or the dispersion mixture containing the constituent ceramic elements, citric acid in no less than the required amount to give rise to oxidative-reductive combustion reaction with an anion of the ceramic constituent ceramic element so as to make a mixed solution; and thermally treating the mixed liquid at 100–500° C. But it may additionally further comprise a step of conducting additional thermal treatment at 700–900° C. to increase crystallinity.

As for the raw material containing the constituent ceramic elements, use is made from among an oxide, carbonate, or nitrate of the constituent ceramic element, its salt with organics or inorganics, or the constituent ceramic elements complex.

As for the constituent ceramic element, it is preferable to use a piezoelectric/electrostrictive ceramic element comprising lead (Pb) and titanium (Ti) as basic constituent elements.

Especially for the constituent ceramic element, it is preferable to use that composed of elements including lead (Pb), zirconium (Zr) and titanium (Ti), or lead (Pb), zirconium (Zr), titanium (Ti)/lead (Pb), magnesium (Mg), niobium (Nb).

As for the solvent or the dispersant to dissolve or disperse the raw material of constituent ceramic elements, one or more used from among water and organic solvents that can dissolve or disperse the raw material containing the constituent ceramic elements. As for the organic solvents, mainly acetic acid, dimethyl formamide, methoxyethanol, alcohols, and glycols are used.

As for the combustion aid, citric acid is used, which is an organic compound that can give rise to a combustion reaction. In the conventional method, the citric acid has been used not as a combustion aid but a complexing agent in order to give reaction uniformity and has been used in a process such as the Pechini process, where a speed-controlled combustion reaction can be induced using citric acid's flammability and complex formation effect.

A mixture is made by adding citric acid into a solution or a dispersed mixture where constituent ceramic elements are dissolved or dispersed. The quantity of the citric acid added shall not be less than the necessary amount to give rise to an oxidative-reductive combustion reaction with the anion of the constituent ceramic element. Reaction speed can be controlled by the quantity of citric acid added.

The mixture made by the addition of the citric acid is thermally treated at 100–500° C. Though the crystallinity of the ceramic phase increases as the temperature for thermal treatment, the citric acid combustion reaction may start enough if the temperature for thermal treatment is over 100° C. Although the reaction can arise even if the temperature for thermal treatment is above 500° C., thermally treating above that temperature is meaningless when compared with the conventional method.

More preferably it shall be thermally treated at 150–300° C. which is a temperature range that can secure suitably the crystallinity of the ceramic phase although it is a considerably low temperature range for a thermal treatment.

If the mixture is thermally treated to vaporize the solvent or the dispersant, the added citric acid acts as a reductive combustion aid and is removed giving rise to a nonexplosive oxidative-reductive combustion reaction with the anion of the constituent ceramic element, when the ceramic oxide is formed without scattering out by virtue of reaction heat generated at this time.

And in the reaction, components other than the constituent ceramic element are removed during a sufficient time of combustion reaction so that the ultrafine ceramic oxide powder of pure type without impurity is obtained.

The particle size of the ultrafine ceramic oxide powder obtained by the method is below 1 $\mu$m, and is specifically 0.01–0.1 $\mu$m. So, it is extremely fine with a uniform powder particle diameter distribution. The primary particles of the powder exist as independent bodies or as a soft aggregate type, and are in a completely burnt ceramic phase so that the weight does not decrease even by additional thermal treatment.

Because the powder has excellent surface reactivity, forming is feasible even with only a thermal treatment at low temperature, the degree of freedom for a vibration plate is high and diverse methods of printing and coating can be applied.

It may additionally comprise a step of conducting additional thermal treatment of the obtained ultrafine ceramic oxide powder at 700–900° C. to increase the crystallinity of the powder produced.

The ceramic paste is prepared by mixing the ceramic oxide powder produced and the ceramic sol solution compatible with the powder and of same or similar composition with the powder.

It is advisable to use PZT, PMN or their solid solution (PZT-PMN) complex oxides as for the ultrafine ceramic oxide powder.

The ceramic oxide powder may additionally comprise one or more components among nickel (Ni), lanthanum (La), barium (Ba), zinc (Zn), lithium (Li), cobalt (Co), cadmium (Cd), cerium (Ce), chromium (Cr), antimony (Sb), iron (Fe), yttrium (Y), tantalum (Ta), tungsten (W), strontium (Sr), calcium (Ca), bismuth (Bi), tin (Sn) and manganese (Mn).

The ceramic sol solution is made on a base of water or organic solvent in which the ceramic composition element is then dissolved. While a variety of 10 organic solvents may be used for the base, it is preferable to use acetic acid, dimethyl formamide, methoxyethanol, alcohols, or glycols.

As for the ceramic composition elements used in preparing the ceramic sol solution it is preferable to use a ceramic composition comprising the component elements including lead (Pb), zirconium (Zr) and titanium (Ti). It is preferable that the concentration of the ceramic sol solution is 0.1–5 M.

It is preferable that the content of the ceramic sol solution is 1–200 parts by weight of the ceramic oxide powder when mixing these two materials because the viscosity of a mixture will be too low as ceramic oxide powder is over diluted if the content of the ceramic sol is above 200 parts by weight and the viscosity will be too high as the content of the ceramic oxide powder is too great if the content of the ceramic sol is below 1 part by weight.

Thus if these two systems of ceramic oxide powder and ceramic sol solution are mixed, liquid phase ceramic sol uniformly coats the solid phase ceramic oxide powder surface while linking the ceramic oxide powder particles so as to effectively fill the voids between powder particles.

Then ceramic oxide powder particle of ceramic specific properties forward in the powder-sol mixture retains suitable fluidity surrounded by ceramic sol of the same or similar composition with the powder, while the ceramic sol acts as reaction medium on the ceramic oxide powder surface so that powder surface reactivity is improved.

Afterwards, when the mixture contacts other organic compounds, the organic material component contained in the sol solution enables the mixture to secure contact interface stability while providing dispersibility and homogeneity.

For a system like this, because sol experiences thermal decomposition to be converted to same or similar composition as the ceramic oxide powder, the linkability between particles in a ceramic system is improved even at low temperature.

Organic solvent for material property control may be added in order to secure the fluidity necessary for forming and stability of mixture of ceramic oxide powder and ceramic sol solution. A variety of materials may be used as for organic solvent for material property control but it is preferable to use alcohols or glycols such as ethanol, polyvinyl alcohol, glycerol, terpineol, polyethylene glycol.

It is preferable to take quantity of the organic solvent for material property control as 1–100 parts by weight of ceramic oxide powder when the solvent is added in the mixture of ceramic oxide powder and ceramic sol because there will be no additional effect of organic solvent for material property control if less solvent is added than 1 part by weight while the mixture will be overdiluted and not retain viscosity so as to be deteriorated in formability if the solvent is added above 100 parts by weight.

It is particularly preferable to add the organic solvent for material property control in 10–40 parts by weight of ceramic oxide powder within the addition range the organic solvent addition effect can be exhibited while suitably maintaining the mixture viscosity.

A small quantity of organic material may also be added to improve homogeneity and dispersibility of the eventual mixture of the mixture of ceramic oxide powder and ceramic sol solution added of the solvent for property control.

It is preferable to use long chain alcohols or polar organic solvents as for the organic material added.

It is preferable to use pentanol or hexanol among long chain alcohols and, it is preferable to use acetyl acetone or methoxyethanol as polar organic solvent.

It is preferable to add the final organic material 1–100 parts by weight of ceramic oxide powder because there will be no additional effect of the organic material if it is added less than 1 part by weight while the eventual mixture will be overdiluted and fail to retain viscosity so as to be deteriorated of formability when forming if it is added above 100 parts by weight.

It is particularly preferable to add the final organic material 10–14 parts by weight of ceramic oxide powder within which addition range its addition effect can be exhibited, suitably maintaining the mixture viscosity.

One piezoelectric/electrostrictive layer is formed by various thick layer and thin layer formation methods such as the sol-gel method, screen printing method, forming method, coating method using the piezoelectric/electrostrictive ceramic paste prepared by the method and is thermally treated at 100–800° C. according to substrate material property and sort of additive.

Single piezoelectric/electrostrictive layer thickness may be adjusted by heat treatment condition or requirement but it is preferable to form it 0.1–10 $\mu$m thick and it is specifically preferable to form it 1–6 $\mu$m thick.

While it has been unable to form a thin piezoelectric/electrostrictive layer when using conventional ceramic oxide powder because ceramic oxide powder particle size was large, so thin a piezoelectric/electrostrictive layer can be formed when using ceramic oxide powder of the present invention because powder particle has fine size.

An upper electrode is formed on the piezoelectric/electrostrictive layer. As for the upper electrode, gold, silver, aluminum, nickel, platinum etc. are formed by various thick and thin layer formation methods of evaporation, sputtering or screen printing so as to be thermally treated then.

A multilayered piezoelectric/electrostrictive ceramic actuator of desired layers is manufactured by repeating the steps of forming piezoelectric/electrostrictive layer and upper electrode by the method.

If a multilayered piezoelectric/electrostrictive ceramic actuator of n layers is compared with a single layered piezoelectric/electrostrictive ceramic actuator, the multilayer actuator can get operation displacement and speed about n times for same voltage applied and can get the same operation displacement and speed as that of single layer only with applied voltage about 1/n times.

And various vibration shapes can be obtained by forming piezoelectric/electrostrictive layer thicknesses differently so as to differentiate the applied electric field per piezoelectric/electrostrictive layer which shapes are advantageously used to control the liquid drop size or to stabilize the meniscus.

Actuator characteristics can be improved by polarizing the multilayered piezoelectric/electrostrictive layer. Greater displacement than for a single piezoelectric/electrostrictive layer or for a nonpolarized piezoelectric/electrostrictive layer can be obtained if we variously control piezoelectric/electrostrictive layer polarization direction.

When metal is used for the vibration plate, a multilayered piezoelectric/electrostrictive ceramic actuator manufactured by the method comprises a metal vibration plate; a piezoelectric/electrostrictive layer on the metal vibration plate formed by using a ceramic paste prepared by mixing one part of ultrafine ceramic oxide powder below 5 μm in particle size made by a nonexplosive oxidative-reductive combustion reaction at a relatively low temperature of 100–500° C. having basic composition elements of lead and titanium and another part of a ceramic colloid solution prepared based on water or an organic solvent and having the same or similar composition with the ultrafine ceramic oxide powder; and an upper electrode formed on the piezoelectric/electrostrictive layer; but the multilayer structure is formed by repetitive alternating heaping of the piezoelectric/electrostrictive layer and upper electrode.

When a ceramic or resious organic compound is used for the vibration plate, the actuator comprises a vibration plate; a lower electrode formed on the vibration plate; a piezoelectric/electrostrictive layer on the lower electrode formed by using a ceramic paste prepared by mixing one part of ultra fine ceramic oxide powder below 5 μm in particle size made by a nonexplosive oxidative-reductive combustion reaction at relatively low temperature of 100–500° C. having basic composition element of lead and titanium and another part of a ceramic colloid solution prepared based on water or organic solvent and having the same or similar composition with the ultrafine ceramic oxide powder; and an upper electrode formed on the piezoelectric/electrostrictive layer; but the multilayer structure is formed by repetitive alternating heaping of the piezoelectric/electrostrictive layer and upper electrode.

Figure 2:
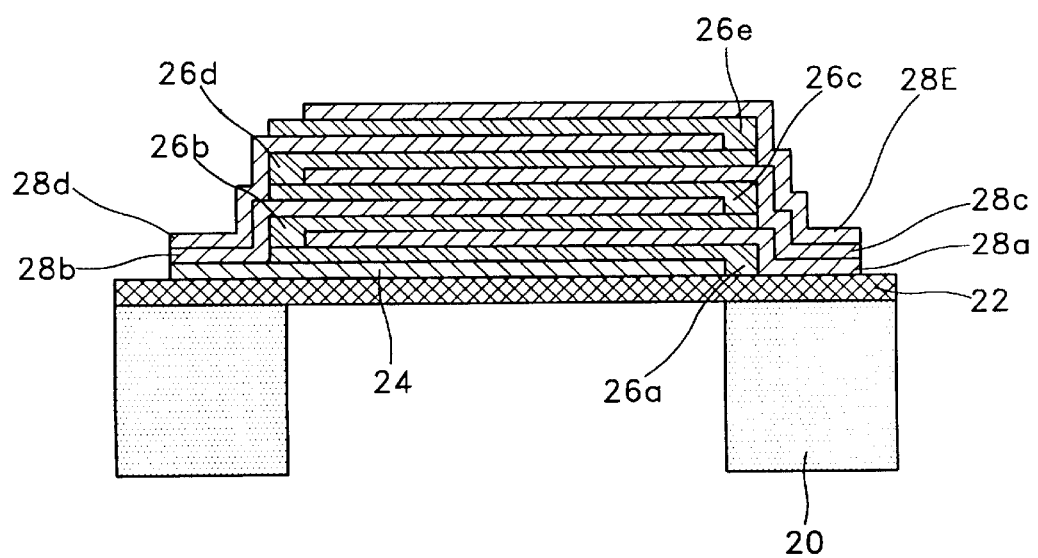
FIG. 2 is a cross sectional view roughly showing a example of a multilayered piezoelectric/electrostrictive ceramic actuator according to the present invention.

FIG. 2 shows a piezoelectric/electrostrictive ceramic actuator heaped up five layers by the present invention.

The actuator of FIG. 2 comprises a five layer structure by repetitive alternating heaping of a piezoelectric/electrostrictive layer (26a)(26b)(26c)(26d)(26e) and an upper electrode (28a)(28b)(28c)(28d)(28e) on a lower electrode (24) formed on vibration plate (22) bonded with chamber plate (20).

When it is heaped up five layers as in FIG. 2, operation displacement and speed of about five times can be obtained when the same drive voltage is applied, while the same operation displacement and speed as with a single layer can be obtained by one fifth the drive voltage.

The present invention as above makes feasible a high quality image and high speed printing, as large displacement and high speed actuating are feasible, because it can achieve great displacement and driving speed even with a small variation in driving voltage, because of piezoelectric/electrostrictive layer and upper electrode altenatingly heaped to a multilayer structure.

Cost expended for circuit formation and manufacture can be reduced because the drive voltage needed to actuate the piezoelectric/electrostrictive ceramic actuator can be greatly decreased.

Various deformation shapes can be obtained by an electric field strength difference between a thin layer and a thick layer by differently forming piezoelectric/electrostrictive layer thickness relative to each other, which shapes can be advantageously used to control the liquid drop size or to stabilize the meniscus.

Actuator characteristics can improve from a single piezoelectric/electrostrictive layer or a nonpolarized piezoelectric/electrostrictive layer by way of polarizing the piezoelectric/electrostrictive layer forming a multilayer structure.

The invention is once again explained in some more detail by the following practical examples.

But the following application example are only illustrations of the invention and do not limit extent of the invention.

EXAMPLE 1

A part of a piezoelectric/electrostrictive fine powder of a PZT-PMN series below 0.5 μm in particle size manufactured by a nonexplosive oxidative-reductive combustion reaction and another part of PZT-methoxyethanol sol of 0.5 M concentration were mixed in a weight ratio of 1:1, and they were then dispersed in an ultrasonic cleaning machine for 30 minutes.

The suspension obtained was worked by spin coating on a silicon substrate plate, where platinum had been vapor deposited to a lower electrode and was partly dried at ordinary temperature, then the piezoelectric/electrostrictive partly dried layer was completely dried at 120° C.

The completely dried piezoelectric/electrostrictive layer was thermally treated at 300° C., whereupon an upper electrode was then vapor deposited.

The piezoelectric/electrostrictive layer was subjected to coating, drying and heat treatment, whereupon again an upper electrode was then vapor deposited and repeated three times, to manufacture a piezoelectric/electrostrictive ceramic actuator heaped up three layers.

EXAMPLE 2

Trimethylene glycol and piezoelectric/electrostrictive fine powder of a PZT series below 0.1 μm in particle size manufactured by a nonexplosive oxidative-reductive combustion reaction were mixed in a weight ratio of 4:6, and were then agitated in an automatic mortar for 6 hours.

PZT-acetic acid sol of 2.0 M concentration was mixed with the mixed solution of trimethylene glycol and powder in a weight ratio of 5:1, and it was then agitated in an automatic mortar for 30 minutes more and was dispersed in an ultrasonic cleaning machine for 30 minutes.

The suspension obtained was worked by dip coating on a stainless steel substrate plate and was partly dried at ordinary temperature, then the partly dried piezoelectric/electrostrictive layer was completely dried at 100° C.

The completely dried piezoelectric/electrostrictive layer was thermally treated at 300° C., whereupon an upper electrode was then vapor deposited.

The piezoelectric/electrostrictive layer was subjected to coating, drying and heat treatment, whereupon again an upper electrode was then vapor deposited and repeated five times, to manufacture a piezoelectric/electrostrictive ceramic actuator heaped up to five layers.

EXAMPLE 3

A part of a piezoelectric/electrostrictive fine powder of a PZT series below 0.1 $\mu$m in particle size manufactured by a nonexplosive oxidative-reductive combustion reaction and another part of PZT-acetic acid sol of 2 M concentration were mixed in a weight ratio of 7:3. PZT sol obtained by hydrolization by adding a small quantity of water into 2 M PZT-acetic acid sol was added to mixture in a weight ratio of 25% of the fine powder, which was so mixed in an automatic mortar. Then a suitable amount of acetic acid was added to ensure suitable viscosity for spin coating and coating was then carried out on a silicon substrate, where a lower electrode of platinum had been formed.

The coated piezoelectric/electrostrictive layer was dried after which it was thermally treated at 300° C., upon which treated layer an upper electrode was then vapor deposited.

The piezoelectric/electrostrictive layer was subjected to coating, drying and heat treatment, whereupon again an upper electrode was then vapor deposited, repeated ten times, to manufactured piezoelectric/electrostrictive ceramic actuator heaped up ten layers.

EXAMPLE 4

2 M PZT-acetic acid sol and a piezoelectric/electrostrictive fine powder of a PZT-PMN series below 0.5 in particle size manufactured by a nonexplosive oxidative-reductive combustion reaction were mixed in a weight ratio of 3:7. Polyvinyl alcohol was added into the mixture in a weight ratio of 10% of the fine powder, which was mixed in an automatic mortar.

Then a suitable amount of methoxyethanol was added to ensure suitable viscosity for spin coating, and coating was then carried out on a silicon substrate where a lower electrode of platinum had been formed.

The coated piezoelectric/electrostrictive layer was dried at 300° C. after which it was thermally treated at 700° C., upon which treated layer an upper electrode was then vapor deposited.

The piezoelectric/electrostrictive layer was subjected to coating, drying and heat treatment, whereupon an upper electrode was then vapor deposited and repeated ten times, to manufacture piezoelectric/electrostrictive ceramic actuator heaped up ten layers.

What is claimed is:

1. A multilayered piezoelectric/electrostrictive ceramic actuator manufactured by a sintering process at low temperature, the actuator comprising:

a metal vibration plate;
a piezoelectric/electrostrictive layer is formed on said vibration plate, including;
  ceramic paste prepared by mixing;
    ultrafine ceramic oxide powder below 5 $\mu$m in particle size by a nonexplosive oxidative-reductive combustion reaction at a relatively low temperature of 100–500° C., having basic composition elements of lead and titanium, and;
    ceramic sol solution of same or similar composition with said ultrafine ceramic oxide powder, prepared on a base of water or organic solvent;
and an upper electrode formed on said piezoelectric/electrostrictive layer, wherein a multilayer structure is formed by forming said piezoelectric/electrostrictive layers and said upper electrodes alternatively of each other.

2. The actuator in claim 1, wherein the thickness of said piezoelectric/electrostrictive layer thickness is 0.1–10 $\mu$m.

3. The actuator in claim 2, wherein the thickness of said piezoelectric/electrostrictive layer is 1–6 $\mu$m.

4. The actuator in claim 1, wherein the thicknesses of said piezoelectric/electrostrictive layers are not equal to each other.

5. The actuator in claim 1, wherein said multilayered piezoelectric/electrostrictive layer is polarized.

6. A multilayered piezoelectric/electrostrictive ceramic actuator manufactured by a sintering process at low temperature, the actuator comprising:

a vibration plate;
a lower electrode formed on said vibration plate;
a piezoelectric/electrostrictive is formed layer on said lower electrode, including;
  ceramic paste prepared by mixing;
    ultrafine ceramic oxide powder below 5 $\mu$m in particle size made by a nonexplosive oxidative-reductive combustion reaction at a relatively low temperature of 100–500° C., having basic composition elements of lead and titanium, and;
    ceramic sol solution of same or similar composition with said ultrafine ceramic oxide powder, prepared on a base of water or organic solvent;
and an upper electrode formed on said piezoelectric/electrostrictive layer, wherein a multilayer structure is formed by forming said piezoelectric/electrostrictive layers and said upper electrodes alternatively of each other.

7. The actuator in claim 6, wherein said vibration plate is made of ceramic.

8. The actuator in claim 7, wherein said ceramic is alumina ($Al_2O_3$), zirconia ($ZrO_2$), silicon (Si), silicon carbide (SiC), silicon nitride ($Si_3N_4$), silicon oxide ($SiO_2$) or glass.

9. The actuator in claim 6, wherein said vibration plate is made of resinous polymeric organic compound.

10. The actuator in claim 9, wherein said resionous polymeric organic compound is polyester, polyimide, polyethyleneimide or Teflon resin.

11. The actuator in claim 6, wherein said piezoelectric/electrostrictive layer is formed 0.1–10 $\mu$m thick.

12. The actuator in claim 11, wherein said piezoelectric/electrostrictive layer is formed 1–6 $\mu$m thick.

13. The actuator in claim 6, wherein the thicknesses of said piezoelectric/electrostrictive layers are not equal each other.

14. The actuator in claim 6, wherein said multilayered piezoelectric/electrostrictive layer is polarized.

* * * * *